US012562550B2

(12) United States Patent
Zhu et al.

(10) Patent No.: US 12,562,550 B2
(45) Date of Patent: Feb. 24, 2026

(54) HIGH-POWER SINGLE-MODE TRIPLE-RIDGE WAVEGUIDE SEMICONDUCTOR LASER

(71) Applicant: CLEMSON UNIVERSITY, Clemson, SC (US)

(72) Inventors: Lin Zhu, Clemson, SC (US); Xiaolei Zhao, Clemson, SC (US); Yeyu Zhu, Clemson, SC (US); Siwei Zeng, Clemson, SC (US)

(73) Assignee: CLEMSON UNIVERSITY RESEARCH FOUNDATION, Clemson, SC (US)

( * ) Notice: Subject to any disclaimer, the term of this patent is extended or adjusted under 35 U.S.C. 154(b) by 969 days.

(21) Appl. No.: 17/734,894

(22) Filed: May 2, 2022

(65) Prior Publication Data

US 2022/0368109 A1 Nov. 17, 2022

Related U.S. Application Data

(60) Provisional application No. 63/183,173, filed on May 3, 2021.

(51) Int. Cl.
*H01S 5/22* (2006.01)
*H01S 5/065* (2006.01)

(52) U.S. Cl.
CPC .............. *H01S 5/22* (2013.01); *H01S 5/0655* (2013.01)

(58) Field of Classification Search
CPC .... H01S 5/22; H01S 5/0655; H01S 2301/166; H01S 2301/18; H01S 5/205; H01S 5/2036
See application file for complete search history.

(56) References Cited

U.S. PATENT DOCUMENTS 6,757,313 B1 * 6/2004 Connolly .............. H01S 5/2231
372/46.015
2006/0098704 A1 * 5/2006 Yamaguchi ............... H01S 5/22
372/43.01

FOREIGN PATENT DOCUMENTS

CN 211265970 U * 8/2020 ............... H01S 5/22

OTHER PUBLICATIONS

Machine translation of CN 211265970 U (Year: 2020).*

(Continued)

*Primary Examiner* — Yuanda Zhang
(74) *Attorney, Agent, or Firm* — DORITY & MANNING, P.A.

(57) ABSTRACT

To achieve high-power single transverse mode laser, we here propose a supersymmetry (SUSY)-based triple-ridge waveguide semiconductor laser structure, which is composed of an electrically pumped main broad-ridge waveguide located in the middle and a pair of lossy auxiliary partner waveguides. The auxiliary partner waveguides are designed to provide dissipative modes that can phase match and couple with the higher-order modes in the main waveguide. By appropriately manipulating the gain-loss discrimination of the modes in the laser cavity, one can effectively suppress all the undesired higher-order transverse modes while keeping the fundamental one almost unaffected, thereby ensuring stable single-mode operation with a larger emitting aperture and accordingly a higher output power than a conventional single-transverse-mode ridge waveguide diode laser.

26 Claims, 5 Drawing Sheets

(56) References Cited

OTHER PUBLICATIONS

Bartolo "Mid-infrared angled-grating distributed feedback laser" Applied Physics Letters 76(22), 3164-3166 (2000).

Brauch et al. "High-Power Diode Lasers for Direct Applications" High-power Diode Lasers, (2000).

Buda et al. "Improvement of the Kink-Free Operation in Ridge-Waveguide Laser Diodes Due to Coupling of the Optical Field to the Metal Layers Outside the Ridge" IEEE Photonics Technolody Letters 15(12), 1686-1688(2003).

El-Ganainy et al. "Supersymetric laser arrays" Phys. Rev. A 92(3), 033818 (2015).

Fan et al. "Improve power conversion efficiency of slab coupled optical waveguide lasers" Opt. Express 22(15), 17666-176722(2014).

Friedrich Bachmann "Industiral applications of high power diode lasers in materials processing" Applied surface science 208, 125-136(2003).

Gao et al. "Analysis of optical gain and threshold current density of 980 nm InGaAs/GaAs compressively strained quantum well lasers" Computational Materials Science 30, 6-302 (2004).

Hayenga et al. "Electrically Pumped Microring Parity-Time-Symmetric Lasers" Proceedings of the IEEE 108(5), 827-836 (2019).

Hirose et al. "Watt-class high-power, high-beam-quality photonic-crystal lasers" Nature Photonics 8(5), 406-411(2014).

Hodaei et al. "Parity-time-symmetric microring laserss" Science 346(6212), 975-978 (2014).

Hodaei et al. "Single mode lasing in transversely multi-moded Ptsymmetric microring resonators" Laser Photonics Rev. 10(3), 494-499 (2016).

Hokmabadi et al. "Supersymmetric laser arrays" Science 363(6427), 623-626 (2019).

Kanskar et al. "Performace and reliability of ARROW single-mode and 100-um laser diode and the use of NAM in AI-free lasers" International Society for Optics and Photonics, 4995, 196-208 (2003).

Leidner et al. "Beam Quality Improvement in Broad-Area Semiconductor Lasers via Evanescent Spatial Filtering" IEEE Journal of Quantum Electronics 48(10), 1269-1274(2012).

Midya et al. "Supersymmetric microring laser arrays" Photonics Research. 7(3), 363-367 (2019).

Nasim et al. "Diode lasers: From laboratory to industry" Optics & Laser Technology 56, 211-222(2014).

Qiao "Higher-dimensional supersymmetric microlaser arrays", Science 372(6540) 403-408 (2021).

Ruter et al. "Observation of parity-time symmetry in optics" Nature Physics 6(3), 192-195 (2010).

Smith et al. "High-Power Slab-Coupled Optical Waveguide Lasers" In 2010 23rd Annual Meeting of the IEEE Photonics Society, pp. 479-480. IEEE, 2010.

Song et al. "Controllable finite ultra-narrow quality-factor peak in a perturbed Dirac-cone band structure of a photonic-crystal slab" Appl. Phys. Lett., 119, 031105 (2021).

Wenzel et al. "Fundamental-Lateral Mode Stabilized High-Power Ridge-Waveguide Lasers With a Low Beam Divergence" IEEE Photonics Technology Letters 20(3), 214-216 (2008).

Wenzel et al. "Suppression of Higher-Order Lateral Modes in Broad-Area Diode Lasers by Resonant Anti-Guiding" IEEE Journal of Quantum Electronics 49(12), 1102-1108(2013).

Wenzel et al. "Thermal lensing in high-power ridge-waveguide lasers" Optical and quantum electronics, 40(5), 379-384 (2008).

Wilkens "High-Efficiency Broad-Ridge Waveguide Lasers" IEEE Photonisc Technology Letters 30(6), 545-548 (2018).

Wilkens et al. "970-nm ridge waveguide diode laser bars for high power DWBC systems" In High-power Diode Laser Technology XVI 2018 (International Society for Optics and Photonics, 2018) p. 105140E.

Wolggang Horn "High Power Diode Lasers for Industrial Applications" Laser Technik Journal, 4(3), 62-65 (2007).

Yoshida et al. "Double-lattice photonic-crystal resonators enabling high-brightness semiconductor lasers with symmetric narrow-divergence beams" Nat. Mater. 18(2), 121-128 (2019).

Zhu et al. "Electrically-pumped, broad-area, single-mode photonic crystal lasers" Optics Express, 15(10), 5966-5975 (2007).

Ziegler et al. "Imaging Catastrophic Optical Mirror Damage in High-Power Diode Lasers" Journal of Electronic Materials, 39(6), 709-714 (2010).

* cited by examiner

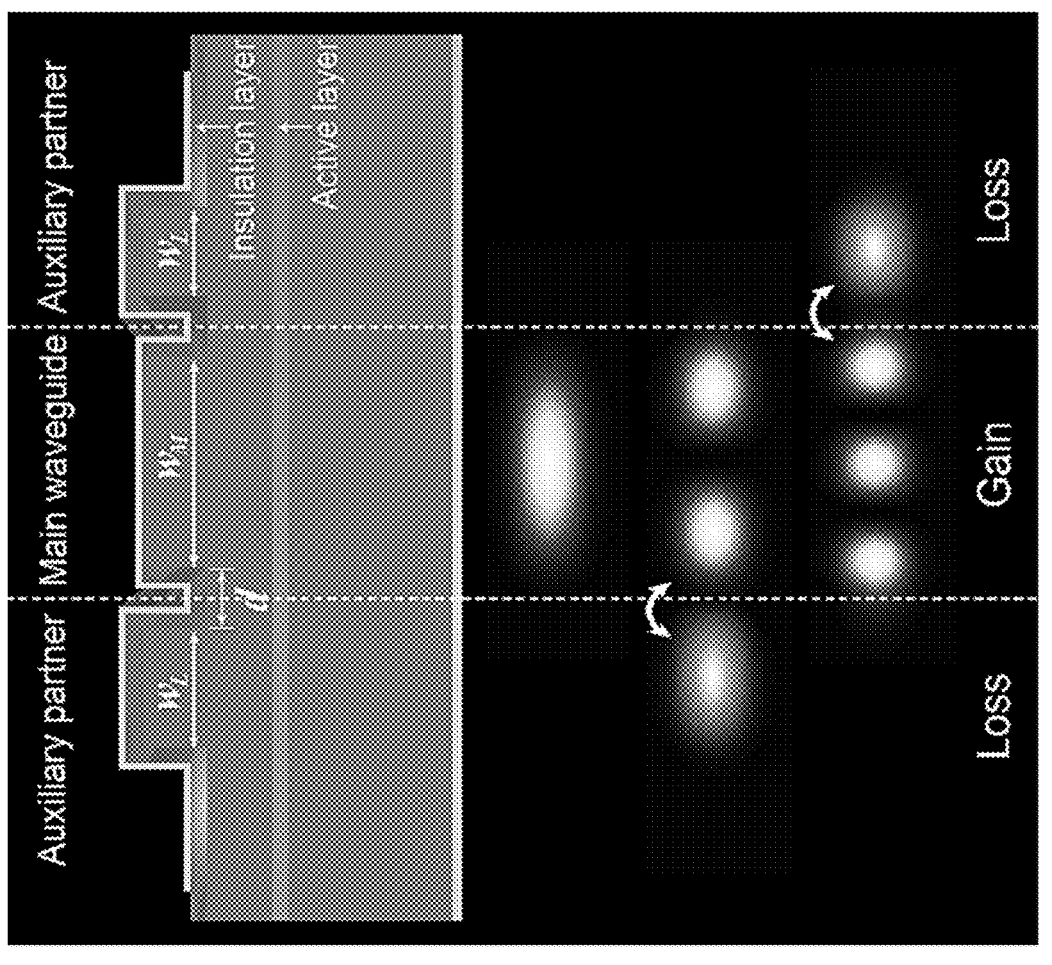
FIG. 1C
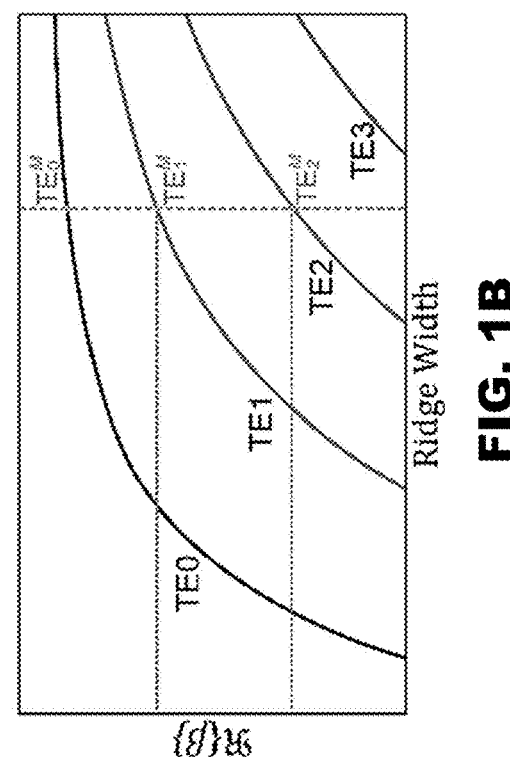
FIG. 1A
FIG. 1B

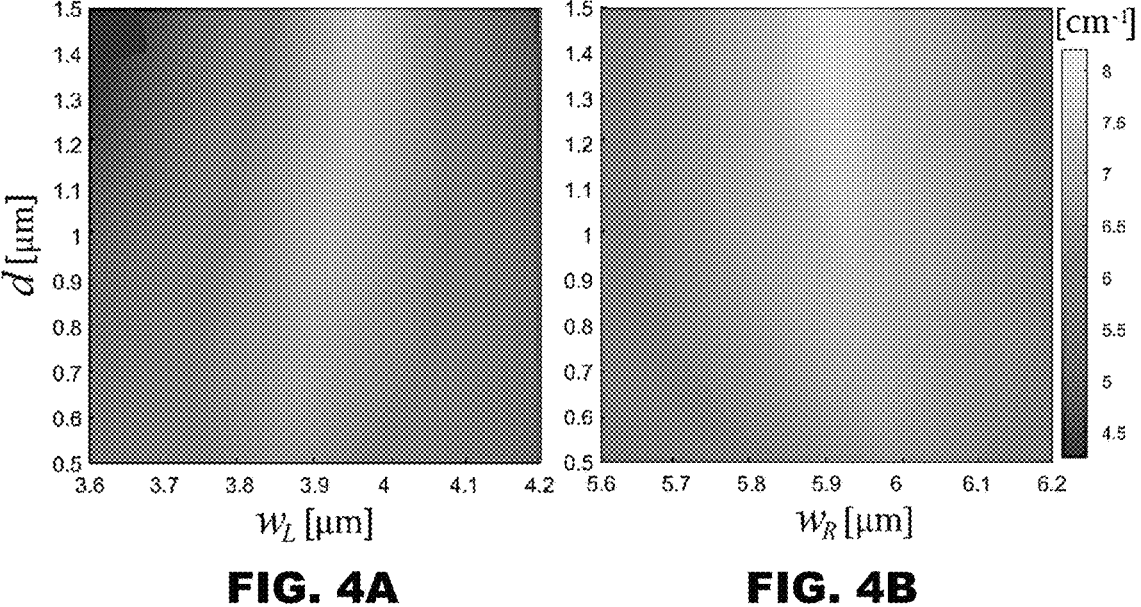
FIG. 4A          FIG. 4B
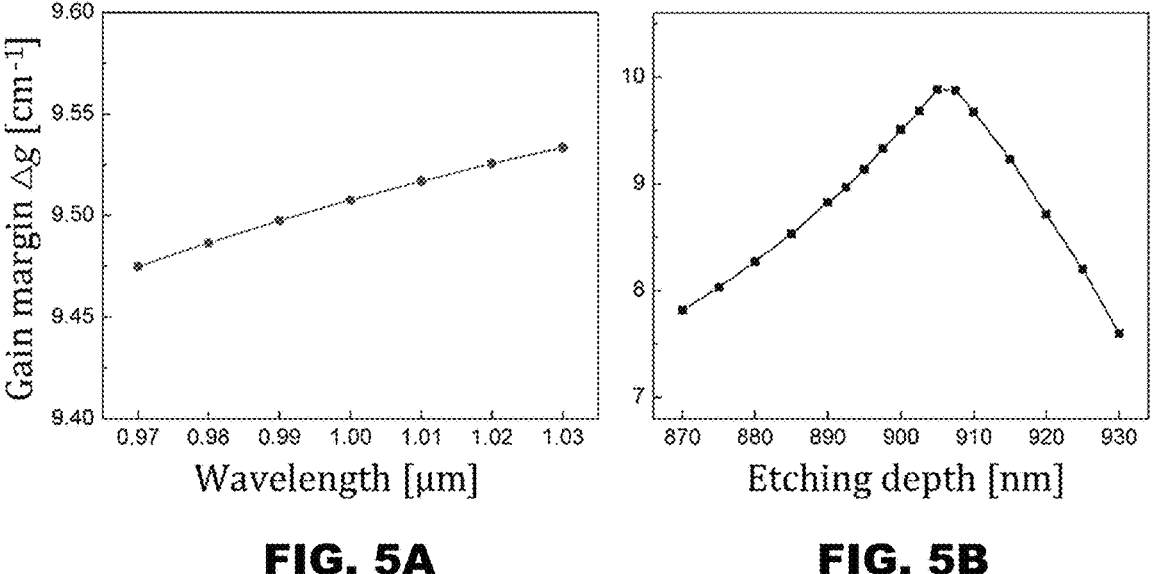
FIG. 5A          FIG. 5B

HIGH-POWER SINGLE-MODE TRIPLE-RIDGE WAVEGUIDE SEMICONDUCTOR LASER

PRIORITY CLAIM

The present application claims the benefit of priority of U.S. Provisional Patent Application No. 63/183,173, titled High-power Single-mode Triple-Ridge Waveguide Semiconductor Laser, filed May 3, 2021, which is fully incorporated herein by reference and for all purposes.

GOVERNMENT SUPPORT CLAUSE

This invention was made with government support under Grant No. W911NF-18-1-0176, awarded by The Army Research Office, and Grant No. N00014-17-1-2556, awarded by The Office of Naval Research. The government has certain rights in the invention.

FIELD

The present disclosure relates generally to lasers. More particularly, the present subject matter relates to high-power single transverse mode lasers using a waveguide-based semiconductor laser structure.

BACKGROUND

High-power semiconductor lasers that operate in the fundamental spatial mode are highly desired in a broad number of applications[1-4], including optical communication, pumping sources, laser surgery, and direct-diode material processing. Typically, an index-guided ridge waveguide (RW) structure is employed to maintain single spatial mode operation. Conventional single-mode RW lasers require a narrow lateral waveguide to suppress or cut off higher-order modes[5]. However, the small modal sizes and small emitting apertures give rise to high-power density operation and poor heat dissipation. Because of the restriction of the optical mirror damage (COMD) and/or thermal rollover effect, the maximum available output power from a conventional RW laser is very limited[6]. In order to address these challenges, the width of the RW laser needs to be increased to scale up the single-mode output power, which requires a weak effective index contrast between the core and cladding. For example, relatively weak index waveguides are used in both Slab Coupled Optical Waveguide Lasers (SCOWLs)[7, 8] and large core lases based on strongly asymmetric epi-designs[9, 10].

However, the weak index guide makes the waveguide structure susceptible to the carrier induced index suppression, thermal lensing, and spatial hole burning effects. It tends to support multiple transverse modes at high drive currents, resulting in mode instabilities manifesting as kinks in the light-output (IL) curves, beam steering, and beam-quality degradation[11]. Clearly, it would be desirable to introduce additional mechanisms in RW laser structure to avoid the onset of higher-order modes and simultaneously obtain high-power. Although there are other methods to obtain high-power single-mode lasers such as angled gratings lasers[12, 13] and super symmetric lasers[14,15], the design and fabrication of these lasers are complex.

One of the competing technologies to realize single-mode and high output power diode laser is the leaky ridge waveguide laser structure with pairs of trenches. However, its emitting aperture is restricted to a few microns, which limits its maximum output power. Another technology is slab-coupled waveguide laser (SCOWL) structure. However, a very small effective index difference is required in the SCOWL structure, which makes it very susceptible to the carrier induced index suppression. In recent years, photonic band crystal (PBC)-based ridge waveguide lasers with ultra large output aperture are proposed for single-mode emission. However, the proposed PBC diode lasers suffer from relatively high internal losses, low efficiency, as well as complex fabrication processes, which hinder higher output power levels and their practical applications. A broad-ridge waveguide laser with an extreme double asymmetric epitaxial wafer is proposed recently. It has shallow residual layer thickness for small effective index difference, leading to reduced lateral current spreading. However, its light-output curves have kinks indicating mode instability at high injection current.

SUMMARY

Aspects and advantages of embodiments of the present disclosure will be set forth in part in the following description, or may be learned from the description, or may be learned through practice of the embodiments.

In general, it is a present object to provide improved semiconductor laser arrangements, and associated methodology. It is a more particular object, in some instances, to provide an improved harvesting of potentially wasted energy that is being produced by ambient vibration, for other effective uses. In some instances, harvested energy may be used to power circuits, for example, for charging or for powering an electrical load.

It is also a present object to provide for obtaining power output for a unit cell or AEMM structure which is optimized through one or more of multi-frequency/multi-modal harvesting, geometric optimization, and PZT position optimization.

A high-power, single transverse mode, edge-emitting diode laser is proposed by constructing a triple-ridge waveguide (TRW) structure. The TRW laser structure consists of a broad-ridge waveguide located in the middle with gain provided by electrical pumping and a pair of lossy auxiliary waveguides placed on both sides of the middle waveguide. The role of the auxiliary waveguides is to provide dissipative modes that can couple with the higher-order modes in the middle waveguide. By appropriately manipulating the gain-loss discrimination of the modes in the laser cavity, one can effectively suppress all the undesired higher-order transverse modes under the threshold while keeping the fundamental one almost unaffected, thereby ensuring single-mode operation with a larger emitting aperture, and accordingly, a higher output power than a conventional single-transverse-mode ridge waveguide diode laser. The proposed TRW laser has no specific requirements for the epitaxial structure and is compatible with the fabrication of a conventional RW laser, making it promising for low-cost and mass production.

The proposed TRW structure achieves single-transverse-mode lasing and high output power simultaneously through equipping the multimode active main waveguide with a pair of lossy auxiliary waveguides. The real parts of the propagation indices of the guided modes supported by the auxiliary waveguides are engineered to match with those of the higher-order modes supported by the main waveguide. By appropriately selecting the coupling coefficient (which can be controlled by adjusting the separation distance between the main and auxiliary waveguide or the etching depth) according to the gain-loss contrast between the main and the auxiliary waveguides, the higher-order modes associated with the main waveguide will couple with the dissipative modes provided by the auxiliary waveguides and split into symmetric and anti-symmetric super mode pairs. Owing to the strong loss added in the auxiliary waveguides, the modal losses, and accordingly, lasing thresholds of the higher-order modes, are significantly increased. On the other hand, the fundamental mode, which has negligible coupling with any dissipative modes, will be well confined in the main waveguide, and thus, will hold the lowest threshold. In this way, all the undesired higher-order mode can be effectively suppressed in mode competition, and thus, single-mode lasing with large emitting aperture and high output power is ensured.

In the proposed scheme, two integrated lossy auxiliary waveguides are utilized to suppress the unwanted higher-order modes in the laser cavity. Proper control of the coupling coefficient and gain loss discriminations ensures stable single-mode lasing in a broad gain region, and thus, enables high output power and high brightness emission. The unique mode filtering mechanism is believed to be very efficient and stable.

The proposed TRW laser can produce single-mode lasing with high output power and high brightness, resulting in a broad of applications including direct-diode material processing (e.g., laser cutting and welding), medical devices (e.g., spectroscopy and laser surgery), LADAR, and free-space optical communication. Besides, it can also find promising applications in the field of integrated optical systems and fiber communication systems, such as pumping sources for fiber lasers and amplifiers.

The proposed strategy can effectively suppress high-order modes while hardly affecting the fundamental mode. Therefore, it is capable of single-mode operation without the expense of increasing the threshold current.

The proposed structure has single-lobe far field pattern so that it has high coupling efficiency with a single-mode optical fiber or an integrated waveguide. Moreover, the broad main waveguide has the mode field dimension in the transverse direction close to that of a standard single-mode fiber, and thus, it is easier to couple the laser beam out with higher alignment tolerance.

The proposed strategy does not require modification of the epitaxial structure and is therefore well compatible with current epitaxial technique. Furthermore, it can be combined with the advanced epitaxial designs, e.g., large-optical-cavity waveguide structure and asymmetric waveguide structure, to achieve better performance.

The current fabrication technique can be well applied to the proposed TRW structure. The broad width of the main waveguide even greatly reduces the difficulty of alignment in fabrication. Hence, the proposed strategy is very favorable for high yield and mass production.

The proposed strategy does not require small effective index difference, making it less susceptible to the carrier-induced index suppression, and thus, enforcing the stability of single-mode operation at high injection currents.

Here, we propose a high-power single transverse mode laser by constructing a triple-ridge waveguide (TRW) structure, schematically shown in FIG. 1A. The proposed structure consists of a broad main waveguide in the middle and a pair of auxiliary waveguides on both sides. We allow the main waveguide to support high-order modes so that the waveguide width is increased without reducing the index contrast. The pump current is confined in the main waveguide to provide optical gain, while the two auxiliary side waveguides are lossy. The auxiliary waveguides are designed to support guided modes that only couple with the high-order modes of the main waveguide, which effectively filters out these high-order modes in the main waveguide. By appropriately manipulating the modal discrimination of the modes in the TRW structure, one can effectively suppress all the undesired modes below the lasing threshold while keeping the fundamental one almost intact, thereby ensuring the single-mode lasing with a larger emitting aperture, and accordingly, a higher output power than a conventional RW laser. The proposed TRW structure does not require a small effective index difference, making it less susceptible to the carrier-induced index suppression, thus providing the stable single-mode operation at high injection currents. Moreover, the proposed strategy has no specific requirements for the epitaxial structure and compatible with the fabrication of a conventional RW laser, making it promising for low-cost and mass production.

One may also use ion implantation during fabrication as an additional way to introduce dopants/loss in the auxiliary waveguides.

One presently disclosed exemplary embodiment of the presently disclosed subject matter relates to a high-power single transverse mode laser. Such apparatus preferably may comprise a triple-ridge waveguide (TRW) structure, having a main waveguide in between a pair of auxiliary waveguides on respective lateral sides of the main waveguide. Further, preferably in such embodiment, the main waveguide is relatively wider than either of the auxiliary waveguides on either side thereof, to support high-order modes of the main waveguide, while optical loss is introduced by the two auxiliary waveguides, which two auxiliary waveguides are respectively configured to support guided modes that only couple with the high-order modes of the main waveguide, to filter out the high-order modes in the main waveguide.

Another presently disclosed exemplary embodiment of the presently disclosed subject matter relates to a high-power single transverse mode laser, comprising a ridged waveguide structure, having a main waveguide and at least one auxiliary waveguide on a lateral side of the main waveguide. Preferably, the main waveguide is relatively wider than the at least one auxiliary waveguide, to support high-order modes of the main waveguide, and the at least one auxiliary waveguide is configured to support at least one guided mode which couples with a higher-order mode of the main waveguide other than its fundamental mode, to suppress at least one higher-order mode in the main waveguide. Optionally, such high-power single transverse mode laser may in some embodiments further comprise another auxiliary waveguide situated on a lateral side of the main waveguide opposite to that of the at least one auxiliary waveguide, so that the main waveguide is situated in between the pair of the two auxiliary waveguides. In such other embodiments, preferably the main waveguide is relatively wider than the auxiliary waveguide, and the pair of auxiliary waveguides each have propagation constants #which match with those of guided modes associated with the main waveguide other than the main waveguide fundamental mode.

It is to be understood that the presently disclosed subject matter equally relates to associated and/or corresponding methodologies. One exemplary such method relates to methodology for providing a high-power single transverse mode laser. Such methodology preferably comprises providing a triple-ridge waveguide (TRW) structure, having a main waveguide in between a pair of auxiliary waveguides on respective lateral sides of the main waveguide, with the main waveguide relatively wider than either of the auxiliary waveguides on either side thereof, to support high-order modes of the main waveguide. Further, such exemplary methodology preferably may include respectively configuring the two auxiliary waveguides to support guided modes that only couple with the high-order modes of the main waveguide, to introduce optical loss by the two auxiliary waveguides, which filters out the high-order modes in the main waveguide.

Another exemplary embodiment of presently disclosed methodology relates to providing an edge-emitting laser diode capable of high-power single-transverse-mode operation based on the principle of unbroken supersymmetry (SUSY). Such exemplary methodology preferably comprises providing a triple-ridge waveguide (TRW) structure, having a main ridge waveguide in between a pair of lossy auxiliary ridge waveguides, with the main ridge relatively wider than either of the auxiliary ridges; and respectively configuring the two auxiliary waveguides to support guided modes that only couple with the higher-order modes of the main waveguide, to introduce optical loss by the two auxiliary waveguides, which suppresses unwanted higher-order modes in the main waveguide other than its fundamental mode.

Other example aspects of the present disclosure may be directed to systems, apparatus, tangible, non-transitory computer-readable media, user interfaces, memory devices, and electronic devices, and one or more processors programmed for performing various related functionalities.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments, uses, and practices of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the Figures or stated in the detailed description of such Figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification, and will appreciate that the presently disclosed subject matter applies equally to corresponding methodologies as associated with practice of any of the present exemplary devices, and vice versa.

These and other features, aspects and advantages of various embodiments will become better understood with reference to the following description and appended claims. The accompanying Figures, which are incorporated in and constitute a part of this specification, illustrate embodiments of the present disclosure and, together with the description, serve to explain the related principles.

6

BRIEF DESCRIPTION OF THE FIGURES

A full and enabling disclosure of the presently disclosed subject matter, including the best mode thereof, directed to one of ordinary skill in the art, is set forth in the specification, which makes reference to the appended Figures, in which:

FIG. 1A depicts an example schematic diagram of an example currently disclosed triple-ridge waveguide (TRW) laser structure, representing fundamental principles of single-mode lasing in the currently proposed triple-ridge waveguide (TRW) laser;

FIG. 1B graphically depicts propagation indices of guided modes in a single ridge waveguide structure as a function of the ridge width;

FIG. 1C illustrates a cross-section of the presently disclosed FIG. 1A TRW laser structure, together with illustration of mode coupling mechanism;

FIG. 4A illustrates the smaller modal discrimination of the supermodes formed by the coupling between $TE_1^M$ and $TE_0^L$ while FIG. 4B illustrates the smaller modal discrimination of the supermodes formed by the coupling between $TE_2{}^M$ and $TE_1{}^R$, when the additional loss is assumed to be $15 \text{ cm}^{-1}$; and FIGS. 5A and 5B illustrate the effect of wavelength variation A and etching depth deviation B on the gain margin $\Delta g$ for single-mode operation in the TRW1 design.

Figure 2A:
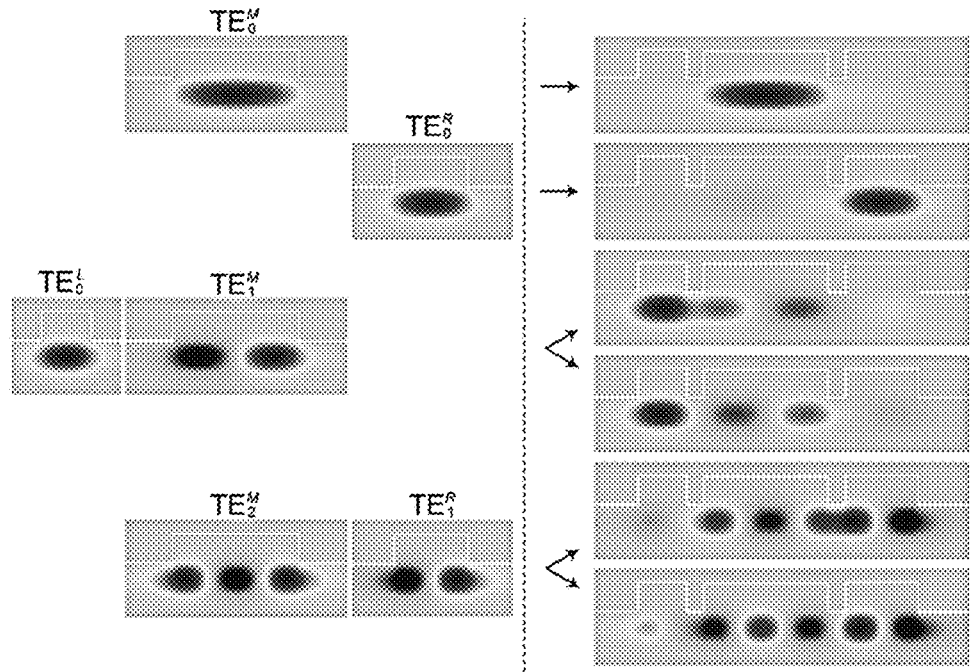
FIG. 2A on the left side illustrates electric field component Ex distributions of the TE modes supported by the isolated RW structures, while the right side thereof illustrates Ex distributions of the TE modes in the TRW structure sorted from the lowest-order (top) to the highest-order (bottom) mode (and with the geometric parameters comprising $w_L$=3.95 μm, $w_M$=10 μm, $w_R$=5.9 5 μm, and d=1.1 μm), all related to mode analysis for TRW1 laser where the main waveguide width is equal to 10 μm.

Repeat use of reference characters in the present specification and drawings is intended to represent the same or analogous features or elements or steps of the presently disclosed subject matter.

DETAILED DESCRIPTION

Reference now will be made in detail to embodiments, one or more examples of which are illustrated in the Figures. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

High-power semiconductor lasers that operate in the fundamental spatial mode are highly desired in numerous applications[1-4], including optical communication, pumping sources, laser surgery, and direct-diode material processing. Typically, an index-guided ridge waveguide (RW) structure is employed to maintain single spatial mode operation. Conventional single-mode RW lasers require a narrow lateral waveguide to suppress or cut off higher-order modes[5]. However, the small modal sizes and small emitting apertures give rise to high-power density and poor heat dissipation. Because of the restriction of the catastrophic optical mirror damage (COMD) and/or thermal rollover effect, the maximum available output power from a conventional RW laser is very limited[6]. To address these challenges, the width of the RW laser needs to be increased to scale up the single-mode output power, which requires a weak effective index contrast between the core and cladding. For example, relatively weak index waveguides are used in both Slab Coupled Optical Waveguide Lasers (SCOWLs)[7,8] and large core lases based on strongly asymmetric epi-designs[9,10].

However, the weak index guide makes the waveguide structure susceptible to the carrier induced index suppression, thermal lensing and spatial hole burning effects. It tends to support multiple transverse modes at high drive currents, resulting in mode instabilities manifesting as kinks in the light-output (IL) curves, beam steering and beam-quality degradation[11]. Clearly, it would be desirable to introduce additional mechanisms in RW laser structure to avoid the onset of higher-order modes and simultaneously obtain high-power. Several methods have been investigated to realize mode-filtering in the lateral direction, such as angled gratings lasers[12,13] and anti-resonant reflective optical waveguide (ARROW) lasers[14]. Photonics crystal resonators are proposed in surface-emitting-type semiconductor lasers for the realization of single-mode operation with larger emission area[15-17]. In recent years, by harnessing notions from the selective breaking of parity-time (PT) symmetry, a novel PT symmetric design approach is established to achieve single-mode lasing in transversely multi-mode microring lasers[18-20]. To further scale up the output power, super symmetric coupled laser arrays based on the principle of unbroken supersymmetry (SUSY) are proposed, showing great promise in generating high-power diffraction-limited lasing output in strip waveguide arrays[21,22], microring resonator arrays[23], and most recently proposed, higher-dimensional microlaser arrays[24].

In light of the SUSY principle, we here propose a high-power single transverse mode laser by constructing a triple-ridge waveguide (TRW) structure, schematically shown in FIG. 1A. Instead of using the laser arrays in the previous SUSY arrangement, our proposed TRW structure consists of a main broad waveguide in the middle and a pair of auxiliary partner waveguides on both sides. We allow the main waveguide to support high-order modes so that the waveguide width is increased without reducing the index contrast. The pump current is injected in the main waveguide to provide optical gain, while extra optical loss is introduced in the two auxiliary partner waveguides. The auxiliary waveguides are designed to support guided modes that only couple with the high-order modes of the main waveguide, which effectively filters out these high-order modes in the main waveguide. By appropriately manipulating the modal discrimination of the modes in the TRW structure, one can effectively suppress all the undesired modes below the lasing threshold while keeping the fundamental one almost intact, thereby ensuring the single-mode lasing with a larger emitting aperture, and accordingly, a higher output power than a conventional RW laser. Compared with SUSY laser array, the proposed TRW is simpler in design, and thus, experimental implementation.

Additionally, avoiding etching in the main ridge waveguide is beneficial to achieving lower optical internal loss and better electrical characteristics.

Moreover, the proposed TRW structure does not require a small effective index difference, making it less susceptible to the carrier-induced index suppression, thus providing the stable single-mode operation at high injection currents.

Moreover, the proposed strategy has no specific requirements for the epitaxial structure and is compatible with the fabrication of a conventional RW laser, making it promising for low-cost and mass production. It is worth noting here that our proposed strategy is different from the reported evanescent spatial filtering in RW or broad area lasers[5, 25-27] which introduces selective losses for higher-order modes by applying the fact that higher-order modes experience greater spatial extent outside the guide (inside the lossy region). These methods do not require phase matching and thus provide relatively low modal discrimination. In addition, since it is difficult for them to keep the fundamental mode intact, the lasers usually show increased thresholds and decreased slopes. By virtue of the novel mode engineering in our proposed TRW structure, more efficient and stable mode filtering with much better modal discrimination can be realized in practice.

FIG. 1A depicts an example schematic diagram of an example currently disclosed triple-ridge waveguide (TRW) laser structure, representing fundamental principles of single-mode lasing in the currently proposed triple-ridge waveguide (TRW) laser. FIG. 1B graphically depicts propagation indices of guided modes in a single-ridge waveguide structure as a function of the ridge width. FIG. 1C illustrates a cross-section of the presently disclosed FIG. 1A TRW laser structure, together with illustration of mode coupling mechanism.

Based on the SUSY quantum field theory in one-dimensional (1D) Schrödinger problems, the unbroken SUSY regime refers to the case when all eigenvalues of the primary infinite potential well are exactly matched to those of its superpartner except for the ground state. The notions of SUSY transformations can be adapted from quantum physics to photonics by exploiting the mathematical isomorphism between the Schrödinger and the Helmholtz equation. In this context, the refractive index distribution plays the role of the potential. The optical guided mode profiles and the corresponding propagation constants are respectively analogous to the eigenfunction and eigenvalues.

As shown in the schematic and cross-section views of the proposed TRW structure (FIGS. 1A and C), the primary (main) waveguide is formed by a broad ridge which supports three transverse electric (TE) modes. To implement the unbroken optical SUSY framework, we construct a lossy superpartner (two lossy auxiliary partner waveguides in the TRW structure) with propagation constant values that match those of guided modes associated with the main waveguide apart from the fundamental mode.

To roughly obtain the ridge widths of the two auxiliary waveguides, we sweep the propagation constants of TE modes versus the ridge width in a single ridge waveguide, as shown in FIG. 1B. The propagation constants $\beta$ are generally complex in a laser cavity. In this Figure, only the real parts of propagation constant are considered. As indicated by the vertical dotted line in FIG. 1B, the main waveguide supports three modes, $TE_0^M$, $TE_1^M$ and $TE_2^M$. As indicated by two horizontal dotted lines, the $TE_1^M$ and $TE_2^M$ modes can respectively find a match in $\Re\{\beta\}$ with the narrower ridge waveguides. In a weakly coupled waveguide system, according to the coupling mode theory, the coupling strength between two modes is determined by the coupling coefficient, phase detuning (difference in $\Re\{\beta\}$) and gain-loss contrast. Efficient coupling will split the coupled modes into symmetric (in-phase) and anti-symmetric (out-of-phase) supermode pairs. Therefore, by engineering the two lossy narrow auxiliary waveguides to phase match with the higher-order modes in the main waveguide, all the higher-order modes will split into supermode pairs except for the fundamental mode.

Since extra optical loss has been added in the auxiliary waveguides, the supermodes will experience higher modal loss and accordingly higher lasing thresholds. In this regard, we should appropriately control the coupling coefficient in the TRW laser structure in such a way that the amplitude distributions of the supermodes have a large spatial overlap with the lossy region. On the other hand, the fundamental mode $TE_0^M$ in the main waveguide, which is decoupled with the lossy auxiliary waveguides, will hold the lowest threshold in the cavity and becomes the lasing mode in the mode competition. Therefore, the proposed TRW structure can effectively suppress the unwanted higher-order modes and ensure the single-mode lasing in a broad ridge waveguide. Note, the main waveguide in the TRW structure is not restricted to support only three modes.

The TRW laser design in this paper uses a conventional InGaAs/GaAs epitaxial wafer, which is comprised of a compressively strained InGaAs single quantum well (SQW), located in a symmetric GaAs waveguide layer with total thickness of 800 nm, 1360 nm-thick $Al_{0.25}Ga_{0.75}$. As n-cladding, 940 nm-thick $Al_{0.25}Ga_{0.75}$. As p-cladding, and 50 nm-thick GaAs p-contact layer on the top. The thicknesses of insulation layer ($SiO_2$) and p metal contact are assumed to be 200 nm and 300 nm, respectively. The peak photoluminescence wavelength of the InGaAs SQW is around 1 um, and thus, the operation wavelength $\lambda$ in the following simulation is assumed to be this value.

The widths of the three ridges are respectively denoted as $w_L$ (left), $w_M$ (main) and $w_R$ (right), as depicted in FIG. 1C. The two trench widths between the three ridges are set equal, and thus both denoted as d. The Finite Difference Eigenmode (FDE) solver in Lumerical is used to perform the mode analysis. The semiconductor materials are modeled with a complex refractive index $n=n_r+i\cdot n_i$, where the real index $n_r$ is calculated by the material composition. The imaginary part $n_i=-g\lambda/4\pi$, where g represents the gain (positive) or loss (negative). The value of background internal loss depends on the epitaxial wafer used, which is not related with the calculated modal discrimination. The enhancement of modal discrimination in the TRW laser structure can be realized by either applying selective mode pumping or introducing additional optical loss in the auxiliary waveguides. We follow the latter approach in this work. To reflect this in the simulation model, a uniform gain is applied to the entire structure and a uniform loss of 20 cm$^{-1}$ is assumed in the auxiliary waveguides. Since we mainly focus on illustrating the operation principle of the TRW laser structure, the method to introduce extra loss will not be discussed in detail. General approaches include ion implantation, selective area regrowth, depositing metallic films, etc. In addition, the charge transport and thermal effects in diode lasers are ignored in this manuscript. But it is worth mentioning that the thermal lens effect under continuous wave (CW) mode can be well addressed in the TRW structure by predesign adjustment and proper heat control.

FIG. 1 illustrates the operation principle of the proposed TRW laser. As shown in the schematic and cross-section view of the TRW structure (FIGS. 1A and C), the main waveguide is formed by a broad ridge which supports TE modes, and gain is provided in this region by current injection. In order to achieve stable single-mode lasing, the two higher-order modes must be suppressed. FIG. 1B shows the calculation results of the propagation constants of TE modes versus the ridge of width in a single ridge waveguide.

FIG. 1 shows fundamental principle of single-mode lasing in the proposed TRW laser. FIG. 1A shows the schematic of the TRW laser structure; FIG. 1B shows the propagation indices of guided modes in a single ridge waveguide structure as a function of the ridge width; and FIG. 1C shows the cross-section of the TRW laser structure with the illustration of mode coupling mechanism.

The propagation constants $\beta$ are generally complex in a laser cavity. In this Figure, only the real parts of propagation constant are considered. As indicated by the vertical dotted line in FIG. 1B, the waveguide supports three modes $TE_0^M$, $TE_1^M$ and $TE_2^M$. As indicated by two horizontal dotted lines, the $TE_1^M$ and $TE_2^M$ modes can respectively find a match in $\Re\{\beta\}$ with the narrower ridge waveguides. Therefore, we construct the TRW structure with two lossy narrow auxiliary waveguides engineered to be phase-matched with the higher-order modes in the main waveguide. The loss in the auxiliary waveguides can be introduced easily by blocking the electrical pumping or applying ion implantation. In a weakly coupled waveguide system, according to the coupling mode theory, the coupling strength between two modes is determined by the coupling coefficient, phase detuning (difference in $\Re\{\beta\}$), and gain-loss contrast. Efficient coupling will split the coupled modes into symmetric (in-phase) and anti-symmetric (out-of-phase) supermode pairs. Since strong loss has been added in the auxiliary waveguides, the supermodes (formed due to the coupling between high-order modes in the main waveguide and guided modes in the auxiliary waveguides) will experience higher modal loss, and accordingly, higher lasing thresholds. In this regard, we should appropriately control the coupling coefficient in the TRW laser structure in such a way that the amplitude distributions of the supermodes have a large spatial overlap with the lossy region. On the other hand, the fundamental mode $TE_0^m$ in the main waveguide, which is decoupled with the lossy auxiliary waveguides, will hold the lowest threshold in the cavity and becomes the lasing mode in the mode competition. Therefore, the proposed TRW structure can effectively suppress the unwanted higher-order modes and ensure the single-mode lasing in a broad ridge waveguide. It is worth mentioning that the main waveguide in the TRW structure is not restricted to support only three modes. In the subsequent paragraphs, two specific designs will be presented to better demonstrate the proposed scheme and elucidate the underlying mechanism and design essentials.

Figure 2B:
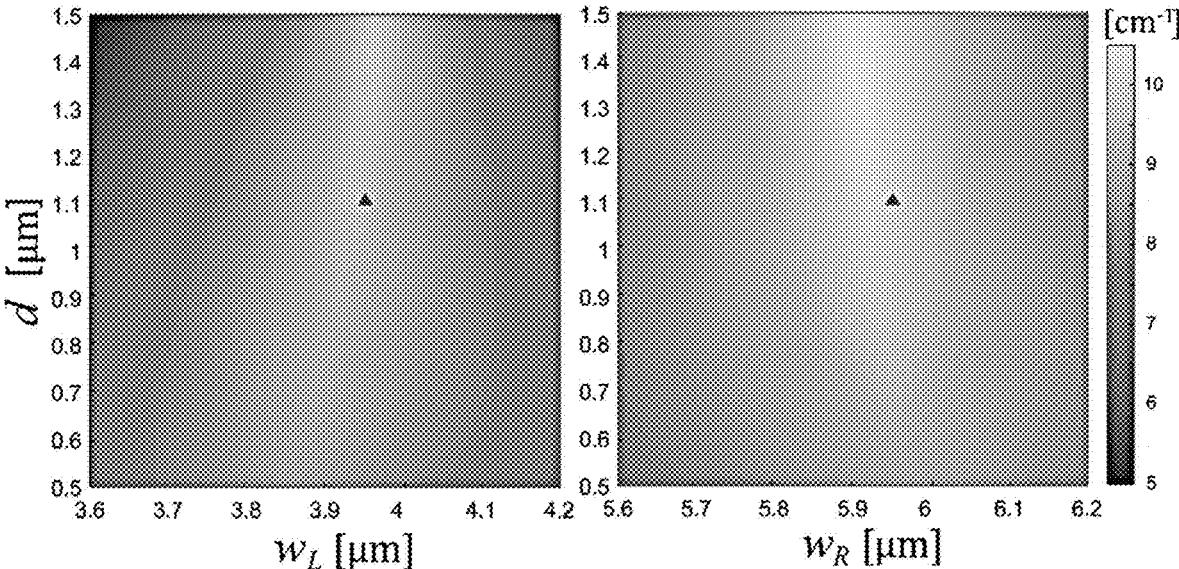
FIG. 2B, on the left side illustrates the sweeping result for the smaller modal discrimination of the supermodes formed by the coupling between $TE_1^M$ and $TE_0^L$ as a function of the left waveguide width $w_L$ and trench width, while the right side thereof illustrates the sweeping result for coupling between $TE_2^M$ and $TE_1^R$ as a function of the right waveguide width $w_R$ and trench width d, again all still related to mode analysis for TRW1 laser where the main waveguide width is equal to 10 μm.
Figure 2C:
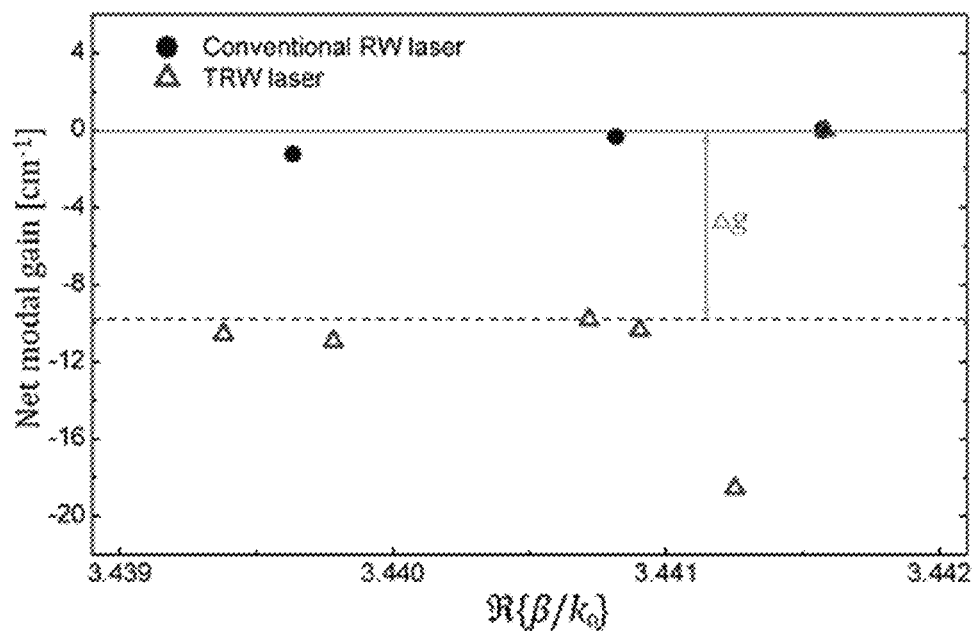
FIG. 2C illustrates the net modal gain of the modes in the conventional RW laser (solid circles) and the modes in the TRW laser structure (hollow triangles), again for the case of the TRW1 laser where the main waveguide width is equal to 10 μm.

We first consider a TRW laser design with the main waveguide supporting three modes. FIG. 2A, on the left side, illustrates electric field component Ex distributions of the TE modes supported by the isolated RW structures, while the right side thereof, illustrates Ex distributions of the TE modes in the TRW structure sorted from the lowest-order (top) to the highest-order (bottom) mode (and with the geometric parameters comprising $w_L=3.95$ μm, $w_M=10$ μm, $w_R=5.95$ μm, and d=1.1 μm), all related to mode analysis for TRW1 laser where the main waveguide width is equal to 10 μm. FIG. 2B, on the left side, illustrates the sweeping result for the smaller modal discrimination of the supermodes formed by the coupling between $TE_1^M$ and $TE_0^L$ as a function of the left waveguide width $w_L$ and trench width, while the right side thereof illustrates the sweeping result for coupling between $TE_2^M$ and $TE_1^R$ as a function of the right waveguide width $w_R$ and trench width d, again all still related to mode analysis for TRW1 laser where the main waveguide width is equal to 10 μm. FIG. 2C illustrates the net modal gain of the modes in the conventional RW laser (solid circles) and the modes in the TRW laser structure (hollow triangles), again for the case of the TRW1 laser where the main waveguide width is equal to 10 μm.

A conventional InGaAs/GaAs epitaxial wafer is employed in this paper. It is comprised of a compressively strained InGaAs single quantum well (SQW), located in a symmetric GaAs waveguide layer with total thickness of 800 nm, 1360 nm-thick $Al_{0.25}Ga_{0.75}$. As n-cladding, 940 nm-thick $Al_{0.25}Ga_{0.75}$As p-cladding and 50 nm-thick GaAs p-contact layer on the top. The peak photo-luminescence wavelength of the InGaAs SQW is around 1 μm, and thus, the operation wavelength λ in the following simulation is assumed to be this value. The widths of the three ridges are respectively denoted as $w_L$(left), $w_M$ (main) and $w_R$ (right), as depicted in FIG. 1C.

The two trench widths between the three ridges are set equal, and thus, both denoted as d. The Finite-Difference Eigenmode (FDE) solver in Lumerical is used to perform the mode analysis. The semiconductor materials are modeled with a complex refractive index $n=n_r+i·n_i$, where the real index $n_r$ is calculated by the material composition. The imaginary part $n_i=-g\lambda/4\pi$, where g represents the gain (positive) or loss (negative). The background internal loss is assumed to be 2 cm$^{-1}$. An additional loss of −20 cm$^{-1}$ is assumed in the lossy regions to represent the quantum adsorption and other introduced losses. In the simulation, only TE modes are considered because the gain for a compressively strained QW is much higher for the TE polarization[16].

In this design, the etching depth is set to be 900 nm, and accordingly, the effective index difference $\Delta n_{eff}$ between the ridge and trench is about 3.5×10$^{-3}$. This relatively large built-in $\Delta n_{eff}$ can effectively suppress the carrier induced anti-waveguide effects. At this etching depth, the isolated main RW with $w_M=10$ μm supports three TE modes, as shown in FIG. 2A. As depicted in the schematic diagram of FIG. 1C, the $TE_0^L$ and the $TE_0^R$ modes are respectively chosen to couple with the $TE_1^M$ and the $TE_2^M$ modes. It can be found in FIG. 1B that the bottom horizontal dotted line (associated with the $TE_2^M$ mode) also has an intersection with the TE1 dispersion curve at a relatively larger width, which can also be utilized to couple with the $TE_2^M$ mode. Considering that the higher-order modes are less confined and thus typically have larger coupling coefficients than lower order ones, $TE_1^R$ mode is chosen to couple with $TE_2^M$ in the design instead of $TE_0^R$.

In order to find the optimum auxiliary waveguide widths and trench widths, parameter sweeping based on two waveguide coupling is performed. The left panel of FIG. 2B plots the sweeping result for the modal discrimination of the two coupled waveguides (the main waveguide and left side waveguide), where the modal discrimination is defined as the modal loss difference between the lowest-loss fundamental mode and the second lowest loss high-order mode. It can be found that a larger trench width indicates a higher modal discrimination at the optimum auxiliary waveguide width but with a smaller margin of error. In practice, it is better to have a larger parameter margin to compensate the fabrication errors, and therefore, a moderate trench width of 1.1 μm is chosen in this design. The right panel of FIG. 2B shows the sweeping result for the coupling between the main waveguide and right waveguide. Owing to the larger coupling coefficient, a larger bright area, i.e., larger margin of error, is clearly observed. The triangle in FIG. 2B indicates the final selected values for the waveguide and trench widths.

FIG. 2C shows the comparison of the net modal gain of the modes in the designed TRW laser structure (triangles) with those in a conventional RW laser (dots). Clearly, the modal discriminations in the conventional RW structure are very small. All the three modes are easy to reach their thresholds, leading to the multimode lasing and degraded beam quality. After introducing two lossy auxiliary waveguides, apart from the fundamental mode, the higher-order modes couple with lossy modes and split into supermodes with much enhanced losses. With a large modal discrimination, the stable single-mode lasing can be obtained. In the TRW laser, as indicated in the FIG. 2C, a high modal discrimination $\Delta g=9.8$ cm$^{-1}$ is achieved for the single-mode operation. Moreover, it is found that the loss of fundamental mode in the TRW structure is only 0.39 cm$^{-1}$ larger than that of the conventional structure, implying that the proposed scheme barely introduces additional loss for the fundamental lasing mode.

We first consider a TRW laser design with the main waveguide supporting three modes. In the simulation, only TE modes are considered because the gain for a compressively strained QW is much higher for the TE polarization[28]. In this design, the etching depth is set to be 900 nm, and accordingly, the effective index difference $\Delta n_{eff}$ between the ridge and trench is about 3.5×10$^{-3}$. This relatively large built-in $\Delta n_{eff}$ can effectively suppress the carrier induced anti-waveguide effects. At this etching depth, the isolated main RW with $w_M=10$ μm supports three TE modes, as shown in FIG. 2A.

As depicted in the schematic diagram of FIG. 1C, the TEL 0 and the TER 0 modes are respectively chosen to couple with the TEM 1 and the TEM 2 modes. It can be found in FIG. 1B that the bottom horizontal dotted line (associated with the TEM 2 mode) also has an intersection with the TE1 dispersion curve at a relatively larger width, which can also be utilized to couple with the TEM 2 mode. Considering that the higher-order modes are less confined and thus typically have larger coupling coefficients than lower order ones, TER 1 mode is chosen to couple with TEM 2 in the design instead of TER 0.

In order to find the optimum auxiliary waveguide widths and trench widths, parameter sweeping based on two waveguide coupling is performed. The left panel of FIG. 2B plots the sweeping result for the modal discrimination of the two coupled waveguides (the main waveguide and left side waveguide), where the modal discrimination is defined as the modal loss difference between the lowest-loss fundamental mode and the second lowest loss high-order mode. It can be found that a larger trench width indicates a higher modal discrimination at the optimum auxiliary waveguide width but with a smaller margin of error. In practice, it is better to have a larger parameter margin to compensate the fabrication errors, and therefore, a moderate trench width of 1.1 $\mu$m is chosen in this design. The right panel of FIG. 2B shows the sweeping result for the coupling between the main waveguide and right waveguide. Owing to the larger coupling coefficient, a larger bright area, i.e., larger margin of error, is clearly observed. The triangle in FIG. 2B indicates the final selected values for the waveguide and trench widths.

FIG. 2C shows the comparison of the net modal gain of the modes in the designed TRW laser structure (triangles) with those in a conventional RW laser (dots). Clearly, the modal discriminations in the conventional RW structure are very small. All the three modes are easy to reach their thresholds, leading to the multimode lasing and degraded beam quality. After introducing two lossy auxiliary waveguides, apart from the fundamental mode, the higher-order modes couple with lossy modes and split into supermodes with much enhanced losses. With a large modal discrimination, the stable single-mode lasing can be obtained. In the TRW laser, as indicated in the FIG. 2C, a high modal discrimination $\Delta g=9.8$ cm$^{-1}$ is achieved for the single-mode operation.

As mentioned before, the proposed TRW structure is capable of filtering out more than two higher-order modes. In what follows, a TRW2 laser design with $w_M=12$ $\mu$m is investigated.

Figure 3A:
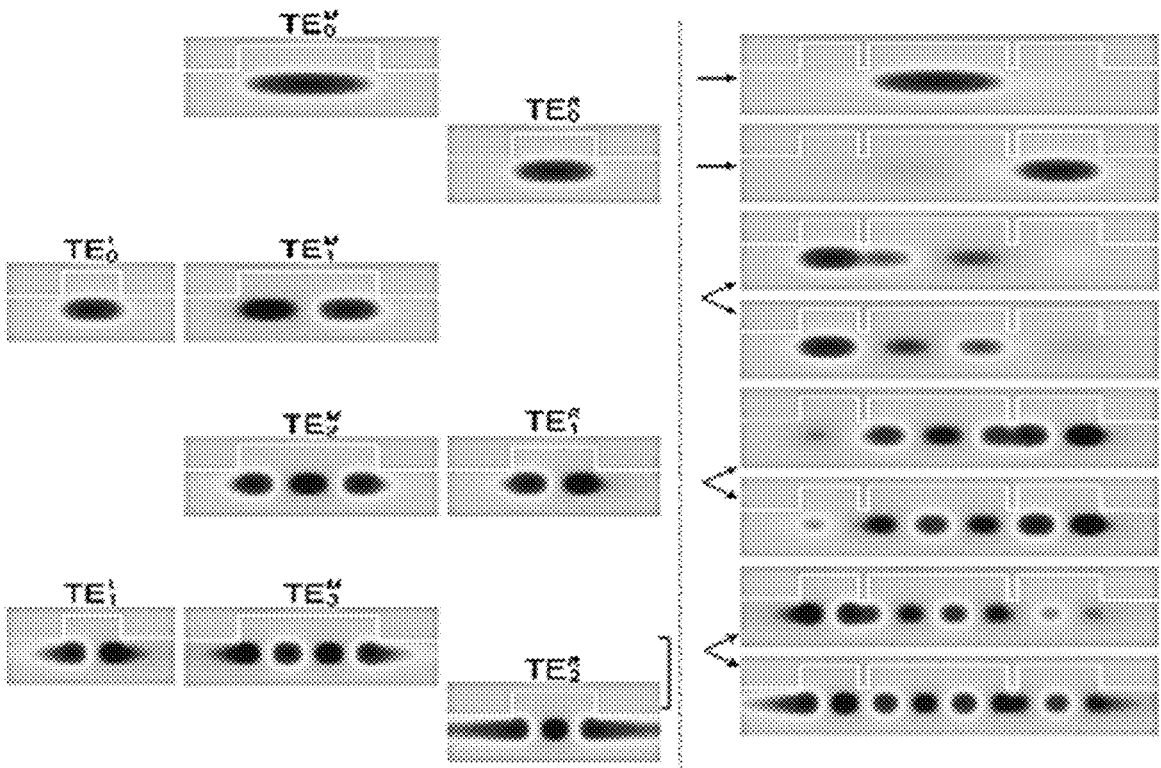
FIG. 3A on the left side illustrates electric field component Ex distributions of the TE modes supported by the isolated RW structures, while the right side thereof illustrates Ex distributions of the TE modes in the TRW structure sorted from the lowest-order (top) to the highest-order (bottom) mode (and with the geometric parameters comprising $w_L$=4.9 μm, $w_M$=12 μm, $w_R$=7.25 μm, and d=0.9 μm), all related to mode analysis for TRW2 laser where the main waveguide width is equal to 12 μm.
Figure 3B:
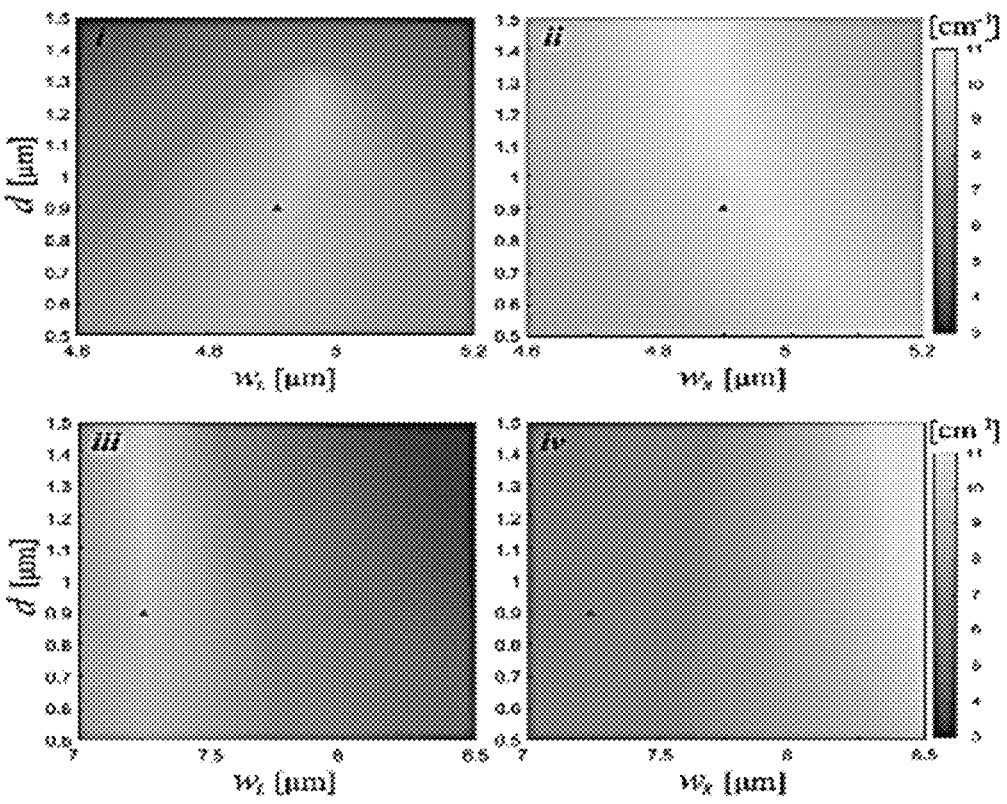
FIG. 3B, on the left side illustrates the sweeping result for the smaller modal discrimination of the supermodes formed by the coupling between i). $TE_1^M$ and $TE_0^L$ modes; ii). $TE_3^M$ and $TE_1^L$ modes; iii). $TE_2^M$ and $TE_1^R$ modes, and iv). $TE_3^M$ and $TE_2^R$ modes, again all still related to mode analysis for TRW2 laser where the main waveguide width is equal to 12 μm.
Figure 3C:
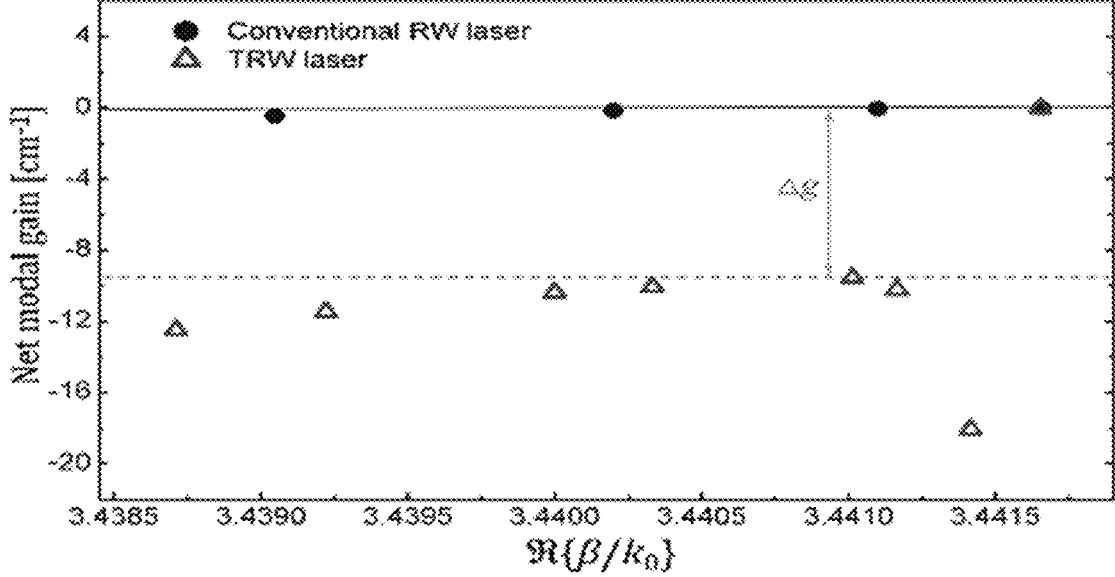
FIG. 3C illustrates the net modal gain of the modes in the conventional RW laser (solid circles) and the modes in the TRW laser structure (hollow triangles), again for the case of the TRW2 laser where the main waveguide width is equal to 12 μm.

FIG. 3A on the left side illustrates electric field component Ex distributions of the TE modes supported by the isolated RW structures, while the right side thereof illustrates Ex distributions of the TE modes in the TRW structure sorted from the lowest-order (top) to the highest-order (bottom) mode (and with the geometric parameters comprising $w_L=4.9$ $\mu$m, $w_M=12$ $\mu$m, $w_R=7.25$ $\mu$m, and d=0.9 $\mu$m), all related to mode analysis for TRW2 laser where the main waveguide width is equal to 12 $\mu$m. FIG. 3B, on the left side illustrates the sweeping result for the smaller modal discrimination of the supermodes formed by the coupling between i). $TE_1^M$ and $T_0^L$ modes; ii). $TE_3^M$ and $TE_1^L$ modes; iii). $TE_2^M$ and $TE_1^R$ modes, and iv). $TE_3^M$ and $TE_2^R$ modes, again all still related to mode analysis for TRW2 laser where the main waveguide width is equal to 12 $\mu$m. FIG. 3C illustrates the net modal gain of the modes in the conventional RW laser (solid circles) and the modes in the TRW laser structure (hollow triangles), again for the case of the TRW2 laser where the main waveguide width is equal to 12 $\mu$m.

The etching depth is also assumed to be 900 nm. In this case, the isolated main waveguide supports four modes, denoted as $TE_0^M$ to $TE_3^M$, as shown in FIG. 3A. Same as the first design, a $TE_0^L$ and a $TE_1^R$ dissipative mode are utilized in the second design to couple with the $TE_1^M$ and the $TE_2^M$ mode, respectively.

The panel i in FIG. 3B shows the modal discrimination of the supermodes formed by the $TE_1^M$-$TE_0^L$ coupling as a function of the auxiliary waveguide and trench widths. We can see that the modal discrimination drops sharply at a larger trench width around 1.35 $\mu$m, indicating a significant decrease in the coupling efficiency. This happens because the gain-loss difference is getting same as the coupling coefficient and thus results in a very weak effective coupling. A continual increase in the trench width will drive it into the so-called parity-time (PT) symmetry broken region[22, 29], i.e., no coupling at all. It can be found that the critical trench width where PT-breaking occurs in this design is less than that in the TRW1 design because the guided modes are better confined in a broader waveguide, leading to a smaller coupling coefficient at the same trench width. Therefore, a smaller trench width of 0.9 $\mu$m is selected in this design, and accordingly, $w_L$ is determined to be 4.9 $\mu$m. In addition to the $TE_0^L$ mode, this left auxiliary waveguide also supports a higher-order mode $TE_1^L$, whose real propagation constant is close to that of the $TE_3^M$ mode. Panel ii plots the parameter sweeping result for the $TE_3^M$-$TE_1^L$ coupling. There is a very large parameter variation margin due to strong mode coupling. This is because both $TE_3^M$ and $TE_1^L$ have a long evanescent tail extending outside waveguide. The sweeping result for $TE_2^M$-$TE_1^R$ coupling is plotted in Panel iii with the red triangle indicating the selected $w_R$ and d values. Despite that the highest order mode $TE_2^R$ supported by the right waveguide is far from the phase matching with $TE_3^M$, it helps to enhance the losses of the supermodes formed by $TE_3^M$ and $TE_1^L$. The out-of-phase $TE_3^M$ and $TE_1^L$ supermode has a smaller $\Re\{\beta\}$, which is close to that of $TE_2^R$, and thus shows a higher loss than the in-phase supermode.

The net modal gain of the modes of TRW2 is shown as the hollow triangles in FIG. 3C. Compared with the conventional RW (solid circles), the modal discrimination $\Delta g$ for the single-mode lasing is increased by 9.5 cm$^{-1}$.

FIGS. 5A and 5B illustrate the effect of wavelength variation A and etching depth deviation B on the gain margin $\Delta g$ for single-mode operation in the TRW1 design.

The lasing wavelength is determined by the longitudinal modes in the cavity. Since the semiconductor quantum well have a broadband gain spectrum, the lasing wavelength might vary among different cavities. FIG. 5A depicts the effect of the wavelength variation on the modal discrimination $\Delta g$. It can be seen that $\Delta g$ is only changed by 0.5 cm$^{-1}$ as the wavelength increases by 60 nm, demonstrating the robustness against the wavelength variation.

Another parameter that affects the modal discrimination in practice is the etching depth. The effect of etching depth deviation on modal discrimination is shown in FIG. 5B. As the etching depth varies $\pm30$ nm, $\Delta g$ changes about 2.2 cm$^{-1}$ in the TRW1 design while still exhibiting a large modal discrimination for the stable single-mode operation.

In summary, we have theoretically introduced a novel TRW structure in edge-emitting laser diodes capable of high-power single-transverse-mode operation. A pair of lossy auxiliary waveguides is equipped in the TRW laser to suppress the unwanted higher-order modes in the laser cavity. In this work, we demonstrate two TRW laser designs, the main broad waveguides of which respectively support two and three higher-order modes besides the fundamental mode. By carefully engineering the TRW structural parameters, both designs achieve large modal discrimination for stable single-mode lasing. It is also shown that the proposed TRW laser is robust to deviations of lasing wavelength and structural parameter, and therefore, very favorable for high yield and mass production.

As mentioned before, the proposed TRW structure is capable of filtering out more than two higher-order modes. In what follows, a TRW2 laser design with $w_M=12$ um is investigated. The etching depth is also assumed to be 900 nm. In this case, the isolated main waveguide supports four modes, denoted as $TE_0^M$ to $TE_3^M$, as shown in FIG. 3A. Same as the first design, a $TE_0^L$ and a $TE_1^R$ dissipative mode are utilized in the second design to couple with the $TE_1^M$ and the $TE_2^M$ mode, respectively. The panel i in FIG. 3B shows the modal discrimination of the supermodes formed by the $TE_1^M$-$TE_0^L$ coupling as a function of the auxiliary wave-guide and trench widths. We can see that the modal dis-crimination drops sharply at a larger trench width around 1.35 μm, indicating a significant decrease in the coupling efficiency. This happens because the gain-loss difference is getting same as the coupling coefficient, thus resulting in a very weak effective coupling. A continual increase in the trench width will drive it into the so-called parity-time (PT) symmetry broken region[29], i.e., no coupling at all. It can be found that the critical trench width where PT-breaking occurs in this design is less than that in the TRW1 design because the guided modes are better confined in a broader waveguide, leading to a smaller coupling coefficient at the same trench width. Therefore, a smaller trench width of 0.9 μm is selected in this design, and accordingly, $w_L$ is deter-mined to be 4.9 μm. In addition to the $TE_0^L$ mode, this left auxiliary waveguide also supports a higher-order mode $TE_1^L$, whose real propagation constant is close to that of the $TE_3^M$ mode. Panel ii plots the parameter sweeping result for the $TE_3^M$-$TE_1^L$ coupling. There is a very large parameter variation margin due to strong mode coupling because both $TE_3^M$ and $TE_1^L$ have a long evanescent tail extending out-side waveguide. The sweeping result for $TE_2^M$-$TE_1^R$ cou-pling is plotted in Panel iii with the triangle indicating the selected $w_R$ and d values. Despite that the highest order mode $TE_2^R$ supported by the right waveguide is far from the phase matching with $TE_3^M$, it helps to enhance the losses of the supermodes formed by $TE_3^M$ and $TE_1^L$. The out-of-phase $TE_3^M$ and $TE_1^L$ supermode has a smaller $\Re\{\beta\}$, which is close to that of $TE_2^R$, and thus shows a higher loss than the in-phase supermode. The net modal gain of the modes of TRW2 is shown as the hollow triangles in FIG. 3C. Com-pared with the conventional RW (solid circles), the modal discrimination Δg for the single-mode lasing is increased by 9.5 cm$^{-1}$.

FIG. 4A illustrates the smaller modal discrimination of the supermodes formed by the coupling between $TE_1^M$ and $TE_0^L$, while FIG. 4B illustrates the smaller modal discrimi-nation of the supermodes formed by the coupling between $TE_2^M$ and $TE_1^R$, when the additional loss is assumed to be 15 cm$^{-1}$.

The lasing wavelength is determined by the longitudinal modes in the cavity. Since the semiconductor quantum well has a broadband gain spectrum, the lasing wavelength might vary among different cavities. FIG. 4A depicts the effect of the wavelength variation on the modal discrimination Δg. It can be seen that Δg is only changed by 0.5 cm$^{-1}$ as the wavelength increases by 60 nm, demonstrating the robust-ness against the wavelength variation. Another parameter that affects the modal discrimination in practice is the etching depth. The effect of etching depth deviation on modal discrimination is shown in FIG. 4B. As the etching depth varies ±30 nm, Δg changes about 2.2 cm$^{-1}$ in the TRW1 design while still exhibiting a large modal discrimi-nation for the stable single-mode operation.

FIG. 5 indicates the effect of wavelength variation A and etching depth deviation B on the gain margin Δg for single-mode operation in the TRW1 design.

In summary, we have theoretically introduced a novel TRW structure in edge-emitting laser diodes capable of high-power single-transverse-mode operation based on the principle of unbroken SUSY. A pair of lossy auxiliary waveguides is equipped in the TRW laser to suppress the unwanted higher-order modes in the laser cavity. In this work, we demonstrate two TRW laser designs, the main broad waveguides of which respectively support two and three higher-order modes besides the fundamental mode. By carefully engineering the TRW structural parameters, both designs achieve large modal discrimination for stable single-mode lasing. It is also shown that the proposed TRW laser is robust to deviations of lasing wavelength and structural parameter, and therefore, very favorable for high yield and mass production.

One may also use ion implantation during fabrication as an additional way to introduce dopants/loss in the auxiliary waveguides. This may further include implanted ions asso-ciated with the auxiliary waveguides for providing addi-tional loss in the auxiliary waveguides. Still further, one may include secondary cross-sectional trenches respectively within the auxiliary waveguides and absorbing layers around the trenches. Such absorbing layers may comprise at least one of Germanium (Ge), Chromium (Cr), alloys of Ge and Cr, and other material with high absorption for the lasing wavelengths of the high-power single transverse mode laser.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclo-sure is by way of example rather than by way of limitation, and the subject disclosure does not preclude inclusion of such modifications, variations and/or additions to the present subject matter as would be readily apparent to one of ordinary skill in the art.

REFERENCES

[1] U. Brauch, P. Loosen, and H. Opower, High-power Diode Lasers, 303-368 (2000).

[2] F. Bachmann, Applied surface science 208, 125-136(2003).

[3] W. Horn, Laser Technik Journal, 4(3), 62-65 (2007).

[4] H. Nasim, and J. Yasir, Optics & Laser Technology 56, 211-222(2014).

[5] H. Wenzel, F. Bugge, M. Dallmer, F. Dittmar, J. Fricke, K. H. Hasler, and G. Erbert, IEEE Photon. Technol. Lett. 20(3), 214-216 (2008).

[6] M. Ziegler, J. Tomm, U. Zeimer, and T. Elsaesser, J. Electron. Mater., 39(6), 709-714 (2010).

[7] J. Fan, L. Zhu, M. Dogan, and J. Jacob, Opt. Express 22(15), 17666-176722(2014).

[8] Smith, G. M., R. K. Huang, J. P. Donnelly, L. J. Missaggia, M. K. Connors, G. W. Turner, and P. W. Juodawlkis, In 2010 23rd Annual Meeting of the IEEE Photonics Society, pp. 479-480. IEEE, 2010.

[9] M. Wilkens, H. Wenzel, J. Fricke, A. Maaßdorf, P. Ressel, S. Strohmaier, A. Knigge, G. Erbert, and G. Tränkle, IEEE Photon. Technol. Lett. 30(6), 545-548 (2018).

[10] M. Wilkens, G. Erbert, H. Wenzel, A. Knigge, P. Crump, A. Maaßdorf, J. Fricke, P. Ressel, S. Strohmaier, B.

Schmidt, and G. Tränkle, In High-power Diode Laser Technology XVI 2018 (International Society for Optics and Photonics, 2018) p. 105140E.

[11]H. Wenzel, M. Dallmer, and G. Erbert, Optical and quantum electronics, 40(5), 379-384 (2008).

[12]R. E. Bartolo, W. W. Bewley, I. Vurgaftman, C. L. Felix, J. R. Meyer, and M. J. Yang, Appl. Phys. Lett. 76(22), 3164-3166 (2000).

[13]L. Zhu, P. Chak, J. K. Poon, G. A. DeRose, A. Yariv, and A. Scherer, Opt. Express, 15(10), 5966-5975 (2007).

[14]M. Kanskar, M. Nesnidal, S. Meassick, A. Goulakov, E. Stiers, Z. Dai, T. E. Earles, D. Forbes, D. Hansen, P. Corbett, and L. Zhang, International Society for Optics and Photonics, 4995, 196-208 (2003).

[15]K. Hirose, Y. Liang, Y. Kurosaka, A. Watanabe, T. Sugiyama, and S. Noda, Nat. Photonics 8(5), 406-411(2014).

[16]M. Yoshida, M. De Zoysa, K. Ishizaki, Y. Tanaka, M. Kawasaki, R. Hatsuda, B. Song, J. Gelleta, and S. Noda, Nat. Mater. 18(2), 121-128 (2019).

[17]A. Y. Song, A. R. K. Kalapala, R. Gibson, K. J. Reilly, T. Rotter, S. Addamane, H. Wang, C. Guo, G. Balakrishnan, R. Bedford, W Zhou, and S. Fan, Appl. Phys. Lett., 119, 031105 (2021).

[18]Hodaei, Hossein, Mohammad-Ali Miri, Matthias Heinrich, Demetrios N. Christodoulides, and Mercedeh Khajavikhan, Science 346(6212), 975-978 (2014).

[19]H. Hodaei, M. Miri, A. U. Hassan, W. E. Hayenga, M. Heinrich, D. N. Christodoulides, and M. Khajavikhan, Laser Photonics Rev. 10(3), 494-499 (2016).

[20]W E. Hayenga, H. Garcia-Gracia, E. S. Cristobal, M. Parto, H. Hodaei, P. LiKamWa, D. N. Christodoulides, and M. Khajavikhan, Proc. IEEE 108(5), 827-836 (2019).

[21]R. El-Ganainy, L. Ge, M. Khajavikhan, and D. N. Christodoulides, Phys. Rev. A 92(3), 033818 (2015).

[22]M. P. Hokmabadi, N. S. Nye, R. El-Ganainy, D. N. Christodoulides, and M. Khajavikhan, Science 363 (6427), 623-626 (2019).

[23]B. Midya, H. Zhao, X. Qiao, P. Miao, W. Walasik, Z. Zhang N. M. Litchinitser, and L. Feng, Photonics Res. 7(3), 363-367 (2019).

[24]X. Qiao, B. Midya, Z. Gao, Z. Zhang, H. Zhao, T. Wu, J. Yim, R. Agarwal, N. M. Litchinitser, and L. Feng, Science 372(6540) 403-408 (2021).

[25]M. Buda, H. H. Tan, L. Fu, L. Josyula, and C. Jagadish. IEEE Photon. Tech. Lett. 15(12), 1686-1688(2003).

[26]J. P. Leidner, and J. R. Marciante, IEEE J. Quan. Electron. 48(10), 1269-1274(2012).

[27]H. Wenzel, P. Crump, J. Fricke, P. Ressel, and G. Erbert, IEEE J. Quan. Electron. 49(12), 1102-1108(2013).

[28]C. H. Gao, H. Y. Ong, W. J. Fan, and S. F. Yoon, Computational Materials Science 30, 6-302 (2004).

[29]C. E. Rüter, K. G. Makris, R. El-Ganainy, D. N. Christodoulides, M. Segev, and D. Kip, Nat. Phys. 6(3), 192-195 (2010).

What is claimed is:

1. A high-power single transverse mode laser, comprising:
a triple-ridge waveguide (TRW) structure, having a main waveguide in between a pair of auxiliary waveguides on respective lateral sides of the main waveguide,
wherein the main waveguide is relatively wider than either of the auxiliary waveguides on either side thereof, to support high-order modes of the main waveguide, while optical loss is introduced by the two auxiliary waveguides, which two auxiliary waveguides are respectively configured to support guided modes that only couple with the high-order modes of the main waveguide, to filter out the high-order modes in the main waveguide,
the pair of auxiliary waveguides are respectively separated from the main waveguide therebetween by a trench having the same trench width d,
the trench has a trench depth which is less than about 1000 nm,
the main waveguide has a width $w_M$<20.0 μm, and supports at least three transverse electric (TE) modes TEM 0, TEM 1, and TEM 2, and
the TE mode 0 for one of the auxiliary waveguides (TEL 0) and the TE mode 0 for the other of the auxiliary waveguides (TER 0) are respectively chosen to couple with the TEM 1 and the TEM 2 modes.

2. A high-power single transverse mode laser according to claim 1, wherein the pair of auxiliary waveguides each have propagation constants β which match with those of guided modes associated with the main waveguide other than the main waveguide fundamental mode.

3. A high-power single transverse mode laser according to claim 1, wherein the trench width d is less than or equal to 2.0 μm.

4. A high-power single transverse mode laser according to claim 3, wherein the trench width d is in a range of from 1.35 μm to 0.9 μm.

5. A high-power single transverse mode laser according to claim 1, wherein the trench depth is about 900 nm.

6. A high-power single transverse mode laser according to claim 3, wherein the main waveguide has a width $w_M$≤20.0 μm, and each of the pair of auxiliary waveguides have widths $w_L$ (waveguide left width) and $w_R$ (waveguide right width) which are each ≤8.0 μm.

7. A high-power single transverse mode laser according to claim 6, wherein the trench width d is about 0.9 μm, the trench depth is about 900 nm, the main waveguide has a width $w_M$ about 12.0 μm, and each of the pair of auxiliary waveguides have widths $w_L$ about 4.9 μm and $w_R$ about 7.25 μm, respectively.

8. A high-power single transverse mode laser according to claim 6, wherein the trench width d is about 1.1 μm, the trench depth is about 900 nm, the main waveguide has a width $w_M$ about 10.0 μm, and each of the pair of auxiliary waveguides have widths $w_L$ about 3.95 μm and $w_R$ about 5.95 μm, respectively.

9. A high-power single transverse mode laser according to claim 6, wherein the effective index difference $\Delta n_{eff}$ between any of the ridges of the triple-ridge waveguide (TRW) structure and the trench is about $3.5\times10^{-3}$.

10. A high-power single transverse mode laser according to claim 1, wherein:
the TRW structure includes an InGaAs/GaAs epitaxial wafer; and
the laser operation wavelength λ is in a range of 0.95 μm to 1.05 μm.

11. A methodology for providing a high-power single transverse mode laser, comprising:
providing a triple-ridge waveguide (TRW) structure, having a main waveguide in between a pair of auxiliary waveguides on respective lateral sides of the main waveguide, with the main waveguide relatively wider than either of the auxiliary waveguides on either side thereof, to support high-order modes of the main waveguide, and
respectively configuring the two auxiliary waveguides to support guided modes that only couple with the high-order modes of the main waveguide, to introduce optical loss by the two auxiliary waveguides, which filters out the high-order modes in the main waveguide, wherein configuring the two auxiliary waveguides includes phase matching the two auxiliary waveguides with the higher-order modes in the main waveguide, such that the higher-order modes, except for the fundamental mode of the main waveguide, will split into symmetric (in-phase) and anti-symmetric (out-of-phase) supermode pairs, whereby the TRW structure effectively suppresses unwanted higher-order modes and ensures single-mode lasing in a relatively broader main ridge waveguide.

12. A methodology according to claim 11, wherein the pair of auxiliary waveguides each have propagation constants $\beta$ which match with those of guided modes associated with the main waveguide other than the main waveguide fundamental mode.

13. A methodology according to claim 11, wherein the pair of auxiliary waveguides are respectively separated from the main waveguide therebetween by a trench having the same trench width d.

14. A methodology according to claim 13, wherein the trench width d is less than or equal to 2.0 μm.

15. A methodology according to claim 14, wherein the trench width d is in a range of from 1.35 μm to 0.9 μm.

16. A methodology according to claim 13, wherein the trench has a trench depth which is less than about 1000 nm.

17. A methodology according to claim 16, wherein the trench depth is about 900 nm.

18. A methodology according to claim 14, wherein the main waveguide has a width $w_M \leq 20.0$ μm, and each of the pair of auxiliary waveguides have widths $w_L$ (waveguide left width) and $w_R$ (waveguide right width) which are each $\leq 8.0$ μm.

19. A methodology according to claim 18, wherein the trench width d is about 0.9 μm, the trench depth is about 900 nm, the main waveguide has a width $w_M$ about 12.0 μm, and each of the pair of auxiliary waveguides have widths $w_L$ about 4.9 μm and $w_R$ about 7.25 μm, respectively.

20. A methodology according to claim 18, wherein the trench width d is about 1.1 μm, the trench depth is about 900 nm, the main waveguide has a width $w_M$ about 10.0 μm, and each of the pair of auxiliary waveguides have widths $w_L$ about 3.95 μm and $w_R$ about 5.95 μm, respectively.

21. A methodology according to claim 18, wherein the effective index difference $\Delta n_{eff}$ between any of the ridges of the triple-ridge waveguide (TRW) structure and the trench is about $3.5 \times 10^{-3}$.

22. A methodology according to claim 16, wherein:
the main waveguide has a width $w_M \leq 20.0$ μm, and supports at least three transverse electric (TE) modes TEM 0, TEM 1, and TEM 2; and
wherein the TE mode 0 for one of the auxiliary waveguides (TEL 0) and the TE mode 0 for the other of the auxiliary waveguides (TER 0) are respectively chosen to couple with the TEM 1 and the TEM 2 modes.

23. A methodology according to claim 11, wherein:
the TRW structure includes an InGaAs/GaAs epitaxial wafer; and
the laser operation wavelength λ is in a range of 0.95 μm to 1.05 μm.

24. A methodology according to claim 11, further including optimizing the respective auxiliary waveguide widths and trench widths by performing parameter sweeping based on two waveguide coupling.

25. A methodology for providing an edge-emitting laser diode capable of high-power single-transverse-mode operation based on the principle of unbroken supersymmetry (SUSY), comprising:
providing a triple-ridge waveguide (TRW) structure, having a main ridge waveguide in between a pair of lossy auxiliary ridge waveguides, with the main ridge relatively wider than either of the auxiliary ridges;
respectively configuring the two auxiliary waveguides to support guided modes that only couple with the higher-order modes of the main waveguide, to introduce optical loss by the two auxiliary waveguides, which suppresses unwanted higher-order modes in the main waveguide other than its fundamental mode;
providing additional loss in the auxiliary waveguides using ion implantation during fabrication of the auxiliary waveguides;
providing secondary cross-sectional trenches respectively within the auxiliary waveguides; and
providing absorbing layers associated with the auxiliary waveguides,
wherein the absorbing layers comprise at least one of Germanium (Ge), Chromium (Cr), alloys of Ge and Cr, and other material with high absorption for the lasing wavelengths of the edge-emitting laser diode.

26. A high-power single transverse mode laser, comprising:
a ridged waveguide structure, having a main waveguide and at least one auxiliary waveguide on a lateral side of the main waveguide,
wherein the main waveguide is relatively wider than the at least one auxiliary waveguide, to support high-order modes of the main waveguide, and
the at least one auxiliary waveguide is configured to support at least one guided mode which couples with a higher-order mode of the main waveguide other than its fundamental mode, to suppress at least one higher-order mode in the main waveguide; and
further comprising another auxiliary waveguide situated on a lateral side of the main waveguide opposite to that of the at least one auxiliary waveguide, so that the main waveguide is situated in between the pair of the two auxiliary waveguides;
implanted ions associated with the auxiliary waveguides for providing additional loss in the auxiliary waveguides;
secondary cross-sectional trenches respectively within the auxiliary waveguides; and
absorbing layers associated with the auxiliary waveguides,
wherein the main waveguide is relatively wider than the auxiliary waveguide,
the pair of auxiliary waveguides each have propagation constants $\beta$ which match with those of guided modes associated with the main waveguide other than the main waveguide fundamental mode, and
the absorbing layers comprise at least one of Germanium (Ge), Chromium (Cr), alloys of Ge and Cr, and other material with high absorption for the lasing wavelengths of the high-power single transverse mode laser.

* * * * *